United States Patent [19]
Donohue et al.

[11] Patent Number: 6,071,822
[45] Date of Patent: Jun. 6, 2000

[54] ETCHING PROCESS FOR PRODUCING SUBSTANTIALLY UNDERCUT FREE SILICON ON INSULATOR STRUCTURES

[75] Inventors: John F. Donohue, Clearwater; David J. Johnson, Palm Harbor; Michael W. Devre, Safety Harbor, all of Fla.

[73] Assignee: Plasma-Therm, Inc., St. Petersburg, Fla.

[21] Appl. No.: 09/127,762

[22] Filed: Jul. 31, 1998

Related U.S. Application Data

[60] Provisional application No. 60/088,460, Jun. 8, 1998.

[51] Int. Cl.[7] .................................................. H01L 21/00
[52] U.S. Cl. ..................... 438/712; 438/714; 438/719; 438/737
[58] Field of Search ................................... 438/712, 714, 438/719, 733, 734, 737, 740; 216/67, 79; 252/79.1

[56] References Cited

U.S. PATENT DOCUMENTS

| | | |
|---|---|---|
| 4,528,066 | 7/1985 | Merkling et al. . |
| 5,336,365 | 8/1994 | Goda et al. ............................. 438/714 |
| 5,501,893 | 3/1996 | Laermer et al. . |
| 5,854,138 | 12/1998 | Roth et al. ............................. 438/714 |
| 5,900,162 | 5/1999 | Kawahara et al. .................. 438/714 X |

*Primary Examiner*—William Powell
*Attorney, Agent, or Firm*—Foley & Lardner

[57] ABSTRACT

A method of anisotropically plasma etching a silicon on insulator substrate wherein undercutting is substantially eliminated by utilizing as a finishing etch step a reactive ion etching process wherein the ion density is reduced in order to limit ion charging through different size recesses in order to uniformly etch in a vertical direction.

27 Claims, 7 Drawing Sheets

ETCHING PROCESS FOR PRODUCING SUBSTANTIALLY UNDERCUT FREE SILICON ON INSULATOR STRUCTURES

This application claims priority of U.S. Provisional Application No. 60/088,460 filed Jun. 8, 1998.

BACKGROUND OF THE INVENTION

1. Field of the Invention The invention relates to an improved method of anisotropically etching semiconductor materials, wherein undercutting of silicon on insulator (SO) structures is substantially eliminated.

2. Description of the Related Art

An important step in the manufacture of silicon containing devices, which includes semiconductor chips, is the etching of different layers such as polysilicon and silicon which make up the finished semiconductor chip or thin film circuit.

SOI structures, such as trenches, have been shown to exhibit undercutting when etching down to the silicon-insulator interface.

The individual structures to be etched into the substrate are usually defined by the etching masks applied to the silicon substrate by way of so-called masking layers, for example, a photoresist layer, which after exposure to UV light and subsequent developing, remains on the substrate, thereby protecting the silicon layer from the etchant.

In an anisotropic etching technique, it is necessary to achieve a laterally exact defined recess (trench via contact) in the silicon. These deeply-extending recesses must have sidewalls which are to be as vertical as possible.

The edges of the masking layers covering those silicon substrate regions that are not supposed to be etched are not undercut in order to keep the lateral precision of the structural transition from the mask into the silicon as high as possible. As a result, it is necessary to allow the etching to progress only on the bottom of the structures, but not laterally on the already produced side walls of the structures.

To this end, it has been proposed to use a plasma-etching method to perform etching of profiles on silicon substrates. In this method chemically reactive species and electrically-charged particles (ions and electrons) are generated in a reactive gas mixture in a reactor with the aid of an electric discharge. The positively-charged cations generated in this manner are accelerated toward the substrate by means of an induced electrical bias through the application of an RF field to the silicon substrate, and fall virtually vertically onto the substrate surface, and promote the chemical reaction of the reactive plasma species with the silicon on the etching base.

Because of the nearly vertical fall of the cations, etching should progress slowly toward the sidewalls of the structures, and in the optimum case, not at all.

It is known to use non-dangerous and process-stable reactive gases based on fluorochemicals. However, although these reactive gases permit a very high etching rate and a very high selectivity between the substrate to be etched and the mask, they display a markedly isotropic etching behavior.

The fluorine radicals generated in the plasma exhibit a high spontaneous reaction rate wherein the structure edges (lateral surfaces) are etched quickly, thus resulting in undesired undercutting of the mask edges, trench sidewalls and undercutting of trenches on the insulator interface.

Different suggestions have been proposed to overcome the problem of undercutting. One such method involves providing a protective layer, for example, in U.S. Pat. No. 4,528,066, a reactive etching technique is disclosed for etching a gate electrode out of layers of tungsten silicide and polycrystalline silicon without etching the insulator layer of silicon dioxide. The sidewalls of the gate are protected from etching by application of a layer of polytetrafluoroethylene.

In U.S. Pat. No. 5,501,893, hereafter called the Bosch process, an etching process is disclosed wherein a silicon substrate first undergoes a plasma etching step which is followed by a second polymerizing step wherein exposed areas are covered by a polymer layer which forms a temporary etching stop. These two steps make up the process by alternately repeating the etching step and the polymerizing step.

An alternative method, as detailed herein, involves covering of the side walls with one or more polymer forming compounds, which compounds are present in the plasma, at the same time during etching, thereby protecting the walls with the polymer film. Because the polymer film would also form on the etching base, a stable fall of ions should keep this film free from polymer and permit etching there. However, associated with this technique there is a disadvantage that the polymer forming compounds added to the plasma, which are partly formed from the fluorine carrier itself or through the splitting of fluorine radicals, or which result from purposely added, unsaturated compounds or eroded. Organic photoresist mask material, occur as recombination partners with respect to the fluorine radicals. By means of this back reaction, the objective of which is a chemical equilibrium, a considerable portion of the fluorine required for etching is consumed, while at the same time a corresponding component of the polymer formers required for side wall passivation is lost. Because of this, the etching rate that can be attained with this method is markedly reduced.

This dependence of the etching fluorine radicals on the unsaturated polymer forming compounds in the plasma makes the etching rates and the etching profiles dependent on the free silicon substrate surface to be etched. This is such because the fluorine radicals react with the polymer forming compounds present in the plasma, thereby reducing the fluorine radicals available for etching the silicon substrate.

Additionally, another disadvantage which can occur is when the unsaturated species present in the plasma that result in the polymer forming compounds, preferably etch certain mask materials and thus cause the selectivity, that is, the ratio of the silicon etching rate to the mask etching rate, to worsen. Furthermore, if a non-uniform side wall protection occurs, the side walls are more heavily coated directly at the mask edge with polymer, and thus the side wall is better protected in this area than in the progressive etching depth of the structures.

If this is the case, the polymer covering of the side walls decreases rapidly at greater depths, and an undercut occurs there with the consequence that bottle-type etching profiles result.

Instead of using reactive gases based on fluorine, it has been proposed to use reactive gases based on other halogens, such as chlorine and bromine or reactive gases that release chlorine or bromine in plasma, because these gases are less reactive on the silicon surface.

The radicals from the reactive gases, typically fluorine radicals generated from, e.g., $SF_6$, $C_4F_8$, and $NF_3$, formed in the plasma exhibit a significantly higher spontaneous reaction with silicon, and first lead to etching with simultaneous ion support. It is generally known that in a capacitively coupled RF lower electrode, a negative self induced DC bias potential is developed on the electrode with respect to ground. Thus, these reactive gases offer the advantage of essentially etching only on the bottom of the structure, and not on the side walls of the structure because the ions impact virtually vertically on the silicon substrate. The disadvantage exists, however, that these reactive gases react in an extraordinarily sensitive manner with respect to moisture.

In this case, not only are costly transfer devices necessary for the silicon substrates in the reactor, but also the leakage rate of the entire etching system must be kept extremely low. Even the slightest occurrence of reactor moisture leads to microroughness on the bottom of the silicon etching due to local silicon oxidation, and thus to a complete breakdown in etching.

SUMMARY OF THE INVENTION

It is one object of the present invention to overcome the disadvantages of the known prior art. Specifically, one object is to develop a method for anisotropic reactive ion etching, wherein ion density is reduced which provides the advantage of substantially reducing undercut of the silicon on insulator interface.

According to one aspect of the invention, the object is accomplished by providing a method of etching a silicon substrate surface wherein substantial etching of the underlying insulating oxide layer is avoided. The method encompasses anisotropic plasma reactive ion etching which acts as a clearing phase wherein a "finishing" etch occurs.

The object of the invention also can be achieved by another aspect of the invention which provides a polymerization deposition process in combination with the reactive ion etching. It is possible to combine the etching species with polymer forming compounds in the plasma. Alternatively, it is contemplated that etching and polymerizing are performed sequentially in the inventive method. As a result, deep structures (e.g., trenches) having vertical edges exhibiting little or no undercutting on silicon on insulator substrates are formed.

Further objects, features, and advantages of the present invention will become apparent from consideration of the preferred embodiments which follow.

DESCRIPTION OF THE PREFERRED EMBODIMENTS

Figure 1:
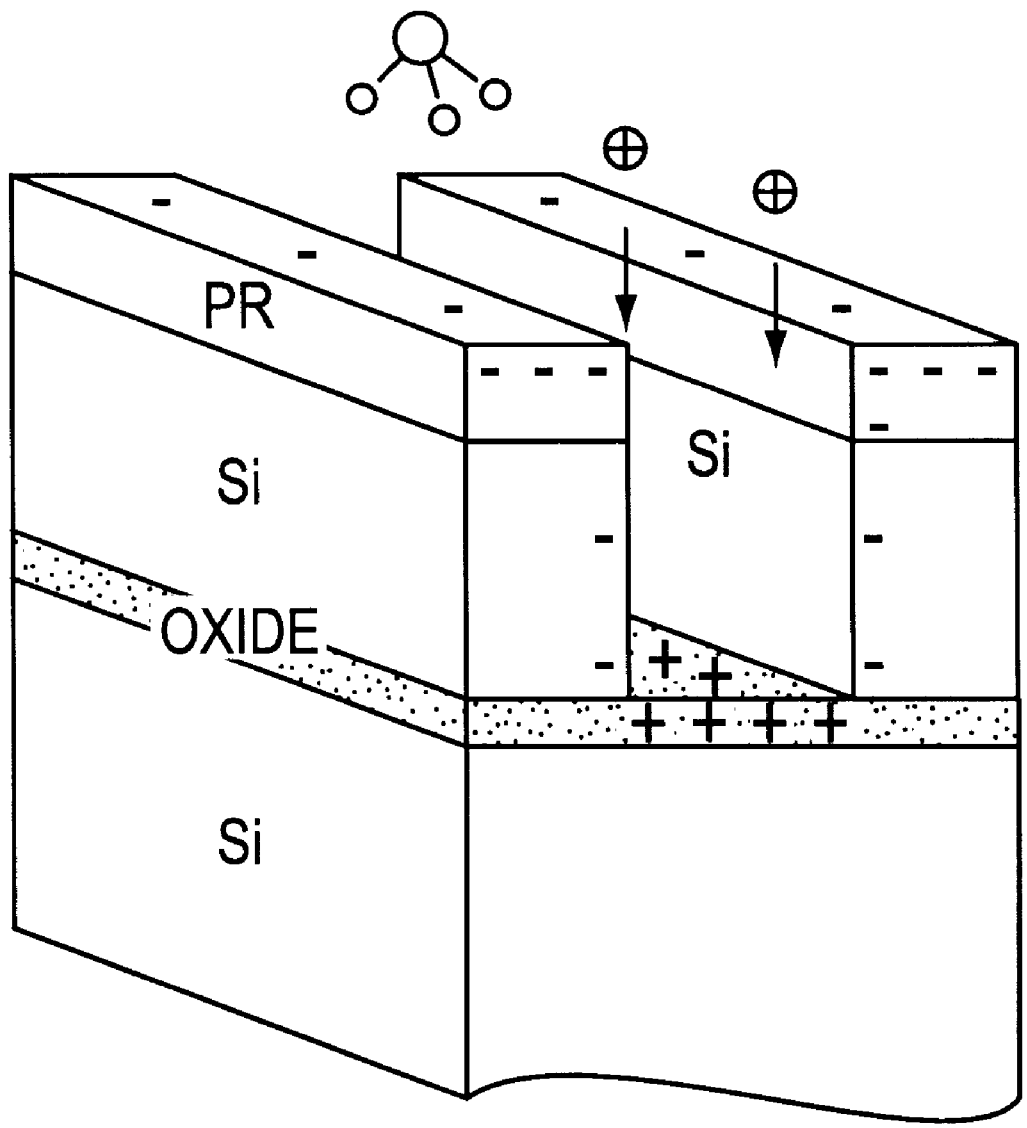
FIG. 1 shows one possible arrangement of charge distribution owing to the nature of the surface features, and is a cross section of a trench.

In order to reduce the undercut at the silicon-oxide interface of the SOI structures, the present inventors have discovered that ion density is an important factor. It is understood that the silicon substrates can include n-type and p-type substrates as well as other silicon blend substrates. The method developed by the inventors to accomplish reduced ion density is to utilize a plasma etching technique during a clearing phase of the etch. That is, the bulk of the etching is performed by any etching technique known to one skilled in the art, wherein the present reduced ion plasma etching technique is then utilized to provide a clearing etch. The present inventors have discovered that by reducing ion density to less than about $10^9$ ions/cm$^3$, undercutting is substantially eliminated. The rates will be slower, but the undercut should be reduced. The intent is to reduce the number of ions entering the trench and thereby eliminate or reduce the charge buildup seen at the trench insulator bottom. The present inventors have determined that it is possible to reduce ion density with a RIE process.

Once the bulk of the silicon is cleared from the higher aspect ratio features, the remainder of the etch takes place using process conditions which favor passivation and reduce the aggressiveness of the etch. This technique does not alter the mechanics of charging at the oxide/silicon interface described above, instead, it relies on the ability to precisely control the degree of overcut.

The inventive clearing phase involves a plasma etching process, preferably reactive ion etching (RIE), wherein the process conditions favor passivation and reduction of the aggressiveness of the etch. The use of a clearing phase or "finish" etch are needed to etch down to the insulator interface. When using plasma etching, lag can develop. Lag is a diffusion limiting condition through different sized trenches/holes which results in slower etch rates as the trench aspect ratio is increased. The majority of etching that is accomplished prior to performing the inventive plasma etching process is isotropic in nature at high ion densities, therefore, plasma etching (RIE) is needed to vertically (anisotropically) etch the recesses at low ion densities for producing straight sidewalls which are perpendicular to the insulator layer and limit charge accumulation.

One method of performing the initial etching comprises a cyclic etching and polymerizing deposition process such as described by Bosch. When the inventive process is performed subsequent to a Bosch process, the plasma etching (RIE) is used to remove polymer from the base since the removal rate of the polymer from the base is greater than the sidewalls.

The polymer layer applied to the etching base during the polymerizing deposition process is rapidly broken through during the subsequent clearing phase of reactive ion etching, because the polymer is stripped very quickly with the ion support, and the chemical reaction of the reactive plasma species with the silicon can progress on the etching base.

During the reactive ion etching of the clearing step, the side walls of the structures to be etched, remain protected by the polymer applied during the polymerization step.

While not wishing to be bound by any one theory, the inventors believe the charge buildup occurs by the following mechanism.

In plasma etch systems with a capacitively coupled RF lower electrode, a negative self induced DC bias potential is developed on the electrode with respect to ground. Owing to Poisson's equation, bias develops due to charge separation. In the case of a negatively biased electrode, an accumulation of electrons must be present on this electrode/wafer in order for the bias to develop. Under time averaged conditions, the accumulation of electrons will increase until the attractive force for ions becomes so great that the number of ions accelerating to the surface equals the number of electrons arriving. In other words, the net DC current to the wafer or electrode is zero. This factor is one of the constraints for a capacitively coupled electrode. Transient currents are present, but no steady state DC currents exist. The present inventors believe that it is these transient currents during steady state that lead to the undercut.

For a flat conductive silicon wafer surface, electron charge distribution across the wafer surface is fairly uniform, i.e., the DC potential across the surface is uniform under steady state conditions. The uniform charge distribution across the wafer leads to uniform ion acceleration towards the wafer. It is known that some surfaces may be conductive while others may be insulators. The electron charge distribution varies across the surface depending upon the characteristics of the surface. Consequently, the electric fields vary. Under quasi-neutral conditions a net zero DC current to the wafer remains steady for silicon features. However, it is during transient stages of local charge buildup, that local DC potentials arise. These local potential variations are what lead to the undercut of silicon on insulator interfaces.

FIG. 1 shows one possible arrangement of charge distribution characterized by the surface features. This represents a cross section of a trench. There is a negative charge along the sidewalls of the silicon and photoresist. This negative charge forms a potential barrier for future electrons entering the trench. The narrower the trench, the stronger the field coupling and hence the barrier.

Figure 2:
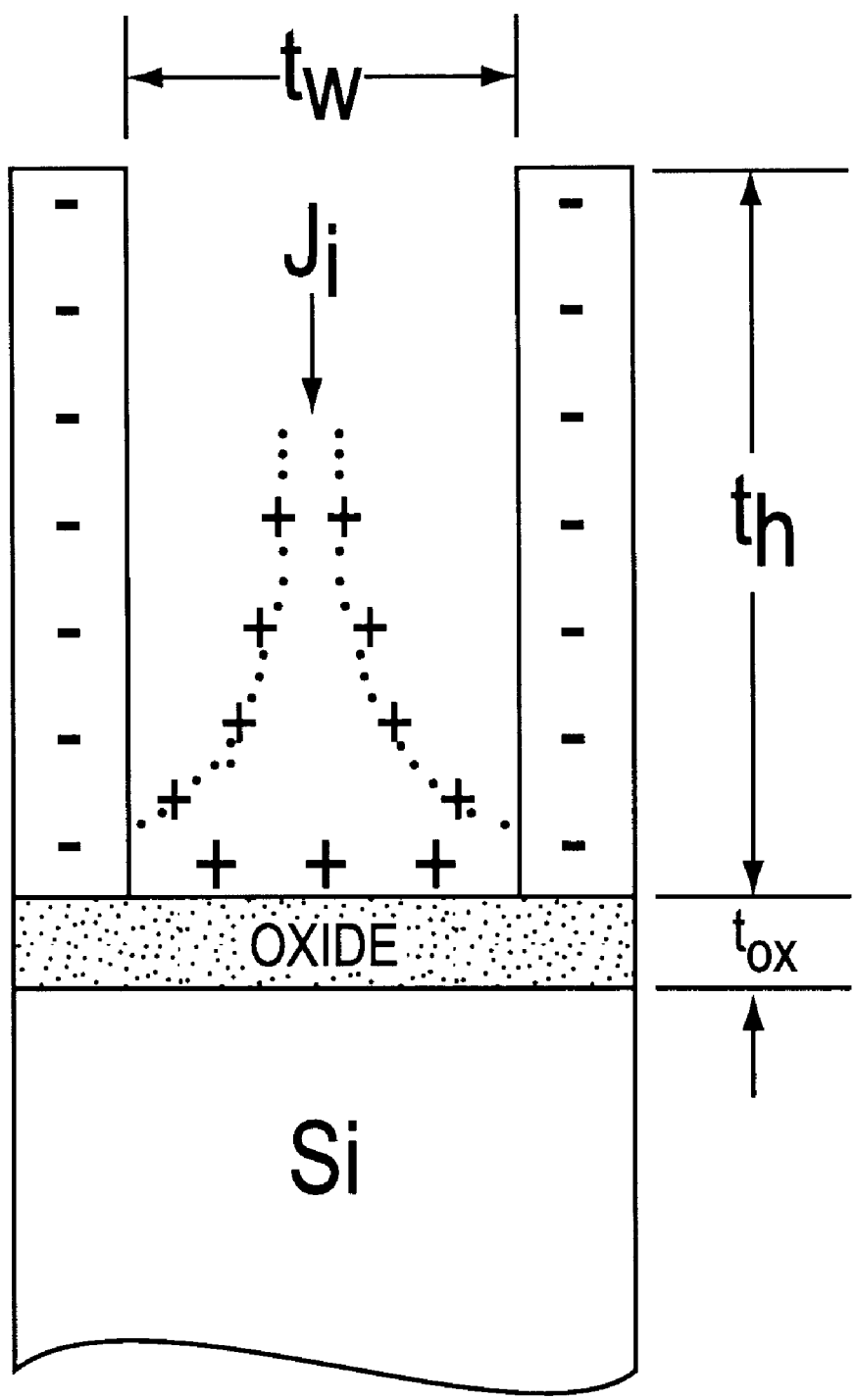
FIG. 2 shows a trench wherein the charge accumulation is depicted along the silicon-oxide interface.

The stronger the barrier, the less likely the electrons are able to penetrate the trench. On the other hand, this charge distribution forms a potential well for ions. Ions have no difficulty entering the trench. But now there is an imbalance, more ions than electrons will be entering the trench, especially the smaller trenches where the electron barrier is greater. These ions will "see" an attractive force toward each of the walls, however, some ions will make it to the bottom of the trench. If the bottom of the trench is an insulator, e.g., $SiO_2$, there is no place for the ion charge to leak or bleed off, consequently a positive charge will build up. This is a scenario where silicon undercut at the oxide interface is likely to occur. There is an attractive force owed to the negative charge of the sidewalls, and a repelling force due to the positive charge buildup at the bottom of the trench. Both attractive and repelling forces curve the path of future ions right into the silicon wall bottom as shown in FIG. 2. Thus, these ions impinge on the silicon wall bottom and create an undercut between the silicon and the insulator layer.

The speed and quantity of the charge buildup is the key factor which leads to the severity of undercut. The buildup depends upon many factors, including, but not limited to, the ion current density, $J_i$, oxide thickness, $t_{ox}$, oxide dielectric constant, $E_{ox}$, and aspect ratio ($t_h/t_w$) of the trench. $J_i$ may be controlled through the inventive process. There are factors that control $J_i$, the ion current density term, which is used to express the current per unit area. The current density is expressed as:

$$J_i = e n_i v_i \quad (1)$$

where, "e", is the electronic charge, $v_i$, the ion velocity and $n_i$, ion density. Thus, by varying electronic charge, ion velocity, and ion density, ion current density is influenced. The average ion velocity can be calculated from the average DC bias, $V_b$, and plasma potential, $\phi p$, across the sheath above the electrode as follows:

$$e(\phi_p - V_b) = \frac{1}{2} m_i v_i^2 \quad (2)$$

When solving for $v_i$ and substituting into Eq. 1, an expression for the average current density of ions arriving at the wafer surface is obtained as shown in Eq 3.

$$J_i = n_i \sqrt{\frac{2e^3(\phi_p - V_b)}{m_i}} \quad (3)$$

Equation 3 shows that 3 main factors are responsible for the current density. The most influential factor and most easily changed is the ion density, $n_i$, because it is directly proportional to ion current and is a function of high density source, which is the main generator of ionic species in the inventive process. The RF power to the lower will also contribute to the ion density, but to a lesser degree than the high density source. The second most important factor in terms of controllability is the DC bias, $V_b$. The bias is a function of many parameters including lower RF power, process pressure, gas species, and frequency. However, the ion current only varies as the square root of the bias, whereas it was a linear function of the ion density. Accordingly, there is less control by varying this factor. The third factor to consider is the mass of the charged species, $m_i$. Since many radicals exist during plasma processing, the mass value may be varied depending upon the etchant gas and the ability of the ICP to fractionate the gases. Increasing the mass of the ions will decrease the current density and vice versa. Since it is only a square root function like the bias, it is not as easily controlled.

The above discussion focuses on a steady state situation, however, there is also a transient situation that leads up to the charge buildup and eventual undercut of the silicon on insulator interface.

Figure 3:
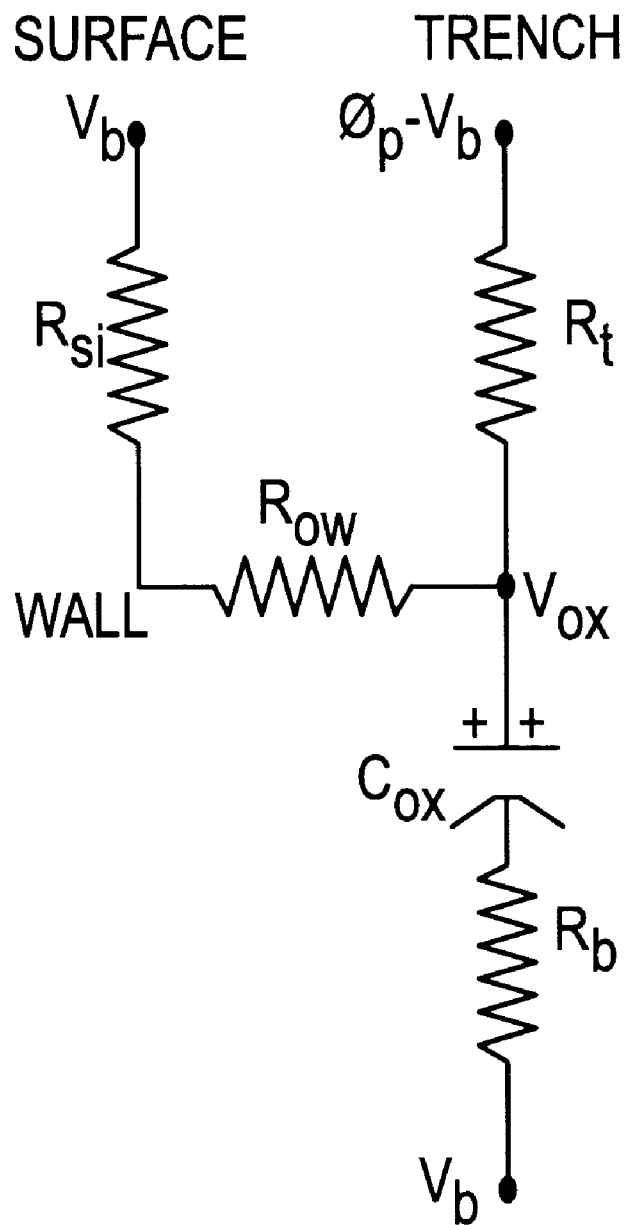
FIG. 3 is an electric circuit which describes the effect of the underlying oxide as a capacitor and its relation to charging.

The electric circuit of FIG. 3 describes the effect of the underlying oxide as a capacitor and its relation to charging. FIG. 3 discloses the electrical properties where a trench has been etched down to the oxide layer. The resistance, $R_t$, represents the number of collisions that occurs as the ion species traverse the trench down to the oxide interface. $R_t$ is a function of the trench width, length, and depth. As more collisions occur, higher values of $R_t$ are exhibited and vice versa. $R_i$ represents the resistance of the silicon beam from the bottom of the wall to the silicon surface. $R_{ow}$, is the resistance between the oxide surface and the bottom of the wall. $C_{ox}$ is the associated capacitance of the oxide at the bottom of the trench. This capacitance depends upon oxide thickness, area, and dielectric constant. $R_b$ is the associated resistance below the oxide through the bulk of the wafer. The DC bias voltage, $V_b$, is negative and represents the measured bias at the wafer surface. In reality, the bias is measured at the electrode, accordingly, there will be some difference between the bias at the wafer surface and the bias at the electrode depending upon the measuring and clamping scheme, i.e., mechanical clamp, ESC (electrostatic chuck), or just simple thermal contact. It is understood that the electrode is at the same potential as the silicon wafer surface. However, all voltages are referenced with respect to ground. The last voltage on the circuit is $V_{ox}$. This voltage is positive and is the final or steady state voltage measured at the bottom of the trench on the oxide surface.

The ions that travel across the sheath to the wafer surface have an average total energy of $\phi p-V_b$. This is the average starting energy of an ion at the wafer surface, i.e., the energy that will be lost through collisions with the walls, other species in the trench, and the oxide surface. Average ions can either bombard the photoresist or enter a trench at the start as seen in FIGS. 2 and 3. If the ions enter a trench, when close enough, the ions can recombine with the silicon wall surface. If the ions traverse down the middle, the ions may reach the oxide surface providing that the ions have enough energy to survive the collisions in the downward path. When the amount of positive charge existing on the oxide surface is small, little deflection or repulsion of the new ions will occur. With time, ions that survive this path to the bottom will continually add to the charge buildup. When the charge buildup reaches a point that further ions are turned away from the oxide surface, there is an increase in the ion current component to the silicon wall through $R_{ow}$. This arises from the large potential difference between the positive oxide and negatively charged silicon wall. The return path is nothing more than recombination at the silicon wall surface which manifests itself as an increase in electron current through the beams to the wall surface through resistance $R_{si}$. There are actually two return paths since there are two walls for every trench. $R_{si}$ represents their combined resistance.

In summary, charge buildup depends upon three factors. One, the charging current, two, the collisions of ions down through the trench, and three, the recombination with the wall surface.

It can be shown that the voltage at the bottom of the trench at the oxide surface will build up exponentially with time to the value $V_{ox}$ shown in FIG. 3. The rate of buildup is dependent upon the values of $R_{eff}$ and $C_{ox}$. The product of these two yields the time constant for the system. Voltage as a function of time, V(t), is given by Eq. 4.

$$V(t) = V_o \left(1 - e^{-\frac{1}{R_{eff} C_{ox}}}\right) \quad (4)$$

$$\text{where } R_{eff} = R_b + \frac{R^t(R_{si} + R_{ow})}{R_t + R_{si} + R_{ow}} \quad (4a)$$

$$\text{and } V_{ox} = \frac{R^{si} + R_{ow}}{R_t + R_{si} + R_{ow}} \phi_p - \frac{R_t}{R_t + R_{si} + R_{ow}} V_b \quad (4b)$$

As theorized, at time zero (t=0), Eq (4) shows that the starting voltage will be zero and that as time becomes very large, V(t) approaches the value of $V_{ox}$. $V_{ox}$ is a function of the plasma potential, $\Phi_p$, and bias $V_b$ as indicated in Eq 4b. As mentioned earlier, the control of $\Phi_p$ is difficult, but $V_b$ can be controlled. Thus, one means for limiting the buildup voltage, $V_{ox}$, is by lowering the bias. Zero $V_b$ would be ideal, but as shown in Eq (3), zero $V_b$ would mean no ion current to the wafer surface. Ion current is needed to etch, but the inventors have discovered that it can be controlled so that buildup of a large $V_{ox}$ at the oxide interface is avoided. The time required to build up $V_{ox}$ is controlled by the product of $R_{eff}$ and $C_{ox}$. Equation (5) shows the relation to the oxide geometry and $C_{ox}$.

$$C_{ox} = \frac{E_o E_{ox} A}{t_{ox}} \quad (5)$$

The exposed area of the oxide is represented by "A" in Eq (5) and is the product of the trench width and length. The dielectric constant of the oxide is given by $\epsilon_{ox}$ and the oxide thickness by $t_{ox}$. Thus, one method to increase the time constant would be to increase the $C_{ox}$ value. Equation (5) provides for the relationship for accomplishing this by decreasing the oxide thickness increasing the dielectric constant, and increasing the area. If trenches have the same depth, but different widths, the smaller trench widths would have smaller capacitances and consequently charge up faster. Theoretically, smaller trenches will show undercut faster than larger ones for the identical process conditions. Since the time constant is also dependent upon $R_{eff}$, increasing resistance would increase the charging time and slow down the undercut. Equation (4a) suggests that the bulk silicon resistance, $R_b$, should be increased. In other words, silicon exhibiting higher resistivity would decrease the undercut. Also, increasing $R_t$, $R_{si}$, and $R_{ow}$ would decrease the undercut. $R_b$ and $R_{si}$ can be calculated, but $R_t$ and $R_{ow}$ are not known. The magnitude of these is important in determining whether or not $R_{si}$ and $R_b$ have much effect on the time it takes to charge up the oxide as well as the value of $V_{ox}$. Although trenches have been described in the above discussion, it will be readily apparent to those skilled in the art that the description is equally applicable to other structures.

The amount of RF power applied during the clearing step is between about 5 and 500 watts, preferably between about 50 and 200 watts, most preferably between about 80 and 150. The flow rate of the etchant gas is about 100–200 sccm and the flow rate of the polymeric gas is about 0–100 sccm, wherein the maximum ratio of etchant to polymer forming compound is 2:1. The pressure during the etching process is about 1 mT–500 mT, preferably about 20–50 mT. The temperature during the etching process is between about 15° C. and 25° C., but can be as low as liquid $N_2$ temperature (–177° C.). The following examples are exemplary only, it is understood that during the RIE step, RF power is applied to the substrate only.

COMPARATIVE EXAMPLE

Figure 4:
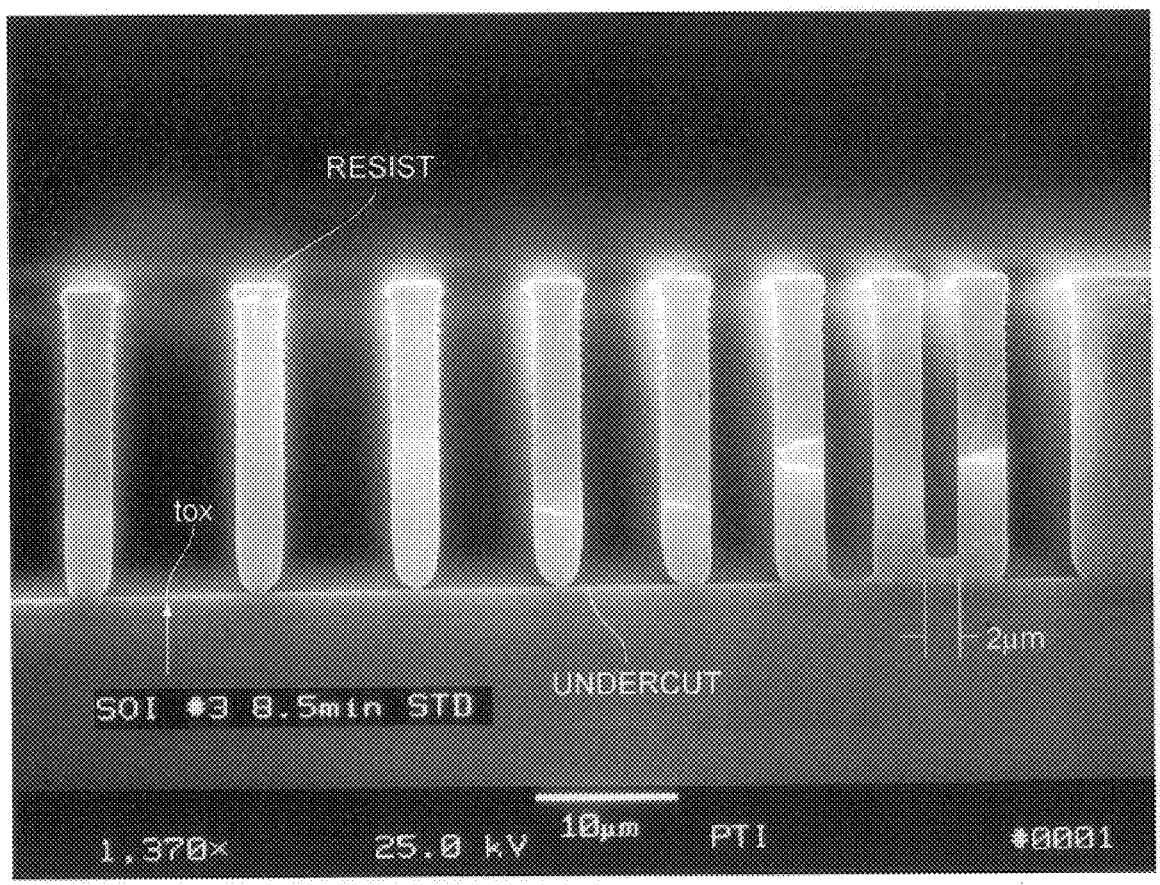
FIG. 4 is a SEM photo depicting undercut occurring in trenches 4 $\mu$m and greater in width at the silicon/oxide interface after an 8.5 minute etch.

FIG. 4 is a SEM photo depicting undercut occurring in trenches 4 $\mu$m and greater in width at the silicon/oxide interface after a standard 8.5 min etch, wherein the standard Bosch process as disclosed in U.S. Pat. No. 5,501,893 was used, which encompasses a three step cyclic process, wherein there are alternating steps of an etching process and a polymerizing deposition process. The etching process is performed for about 2–6 seconds, at about 23 mT of pressure, at a temperature of about 15° C., with about 825 W of power applied, wherein the gas flow rate of reactive gas is about 50–100 sccm and the gas flow rate of the inert gas is 40 sccm. The polymerizing deposition process is performed for about 5 seconds, at about 22 mT of pressure, at a temperature of about 15° C., with about 825 W of power applied, wherein the gas flow rate of reactive gas is about 70 sccm and the gas flow rate of the inert gas is about 40 sccm. The oxide thickness (20,000 Å) is represented by $t_{ox}$. The undercutting occurred while trying to clear out the 2 $\mu$m trench. The 3 $\mu$m trench. $3^{rd}$ trench from the right, has not quite reached the oxide interface, but shows no sign of any undercut in the silicon. The 4 $\mu$m trench, just to the left of the 3 $\mu$m trench, already show signs of undercut. This undercut provides evidence of how quickly the smaller trenches charge up versus the larger ones. The associated capacitance is smaller due to the smaller exposed oxide area. Smaller capacitances charge up and reach steady state quicker when using the same charging current. The charge up leads to the off axis ion bombardment and recombination with the wall surfaces.

Figure 5:
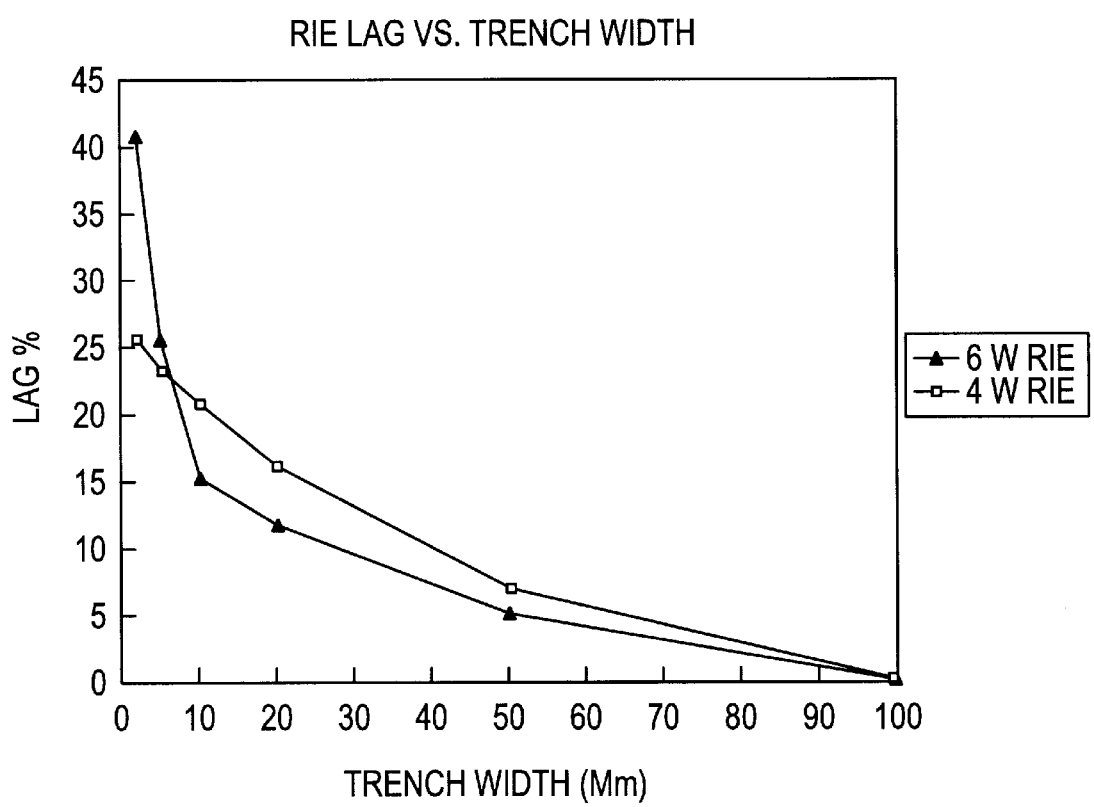
FIG. 5 shows a graph of the lag % vs. trench width for two different lower RIE powers.

In performing an etch of a silicon substrate, one factor to consider is an inherent lag exhibited in the etching of smaller features. To get an idea of the amount of lag, FIG. 5 shows a graph of the lag % vs. trench width for two different lower RIE powers. For comparative purposes, the lags are all referenced to the 100 μm trench widths. Looking at the 9 W RIE curve (dark diamonds), a 20 μm hole with a lag of 12% etches 12% slower than a 100 μm hole. Measurements were taken down to a 2μ hole with a lag of slightly over 40%. Lag is reduced when a smaller RIE wattage is utilized. Some control of lag is possible with the RIE, but it is not sufficient, so careful selection is taken to appropriately cease an etching process that provides the major amount of etching. The etch rate in RIE has approximately 2 orders of magnitude less ion density than a high density source, so the etch rate will be slower. As shown by Eq (4b), the bias $V_b$ contributes to the voltage buildup, $V_{ox}$ in the trench. Thus, bias must be sufficiently high to allow enough ions to get to the wafer surface. Equation (3) shows that the ion density is proportional to the square root of bias. Thus, when ion density is down, higher biases can be utilized than otherwise would have been allowed with a high density source. Accordingly, reduced lag is one unexpected advantage that occurs with the present invention.

Another important factor is the selectivity to the mask/resist layer. Higher biases will generally deteriorate resist rapidly due to physical bombardment, thus control of bias effects selectivity.

EXAMPLES

The following examples utilize the standard Bosch for the initial etch wherein three cyclic steps are performed. The etching process is performed for about 2–6 seconds, at about 23 mT of pressure, at a temperature of about 15° C., with about 825 W of power applied, wherein the gas flow rate of reactive gas is about 50–100 sccm and the gas flow rate of the inert gas is 40 sccm. The polymerizing deposition process is performed for about 5 seconds, at about 22 mT of pressure, at a temperature of about 15° C., with about 825 W of power applied, wherein the gas flow rate of reactive gas is about 70 sccm and the gas flow rate of the inert gas is about 40 sccm. The inventive etching process follows this initial etching process. The RIE process is performed for about 4 minutes, with bias applied to the substrate of about 80 W, at a pressure of about 25–35 mT, at a temperature of about 20° C., wherein the gas flow of reactive gas is about 200 sccm. The inventive process can involve a cyclic etch and polymerizing deposition process. The polymerizing deposition process is performed for about 5 seconds, at about 25 mT of pressure, at a temperature of about 15° C., with bias of about 825 W, wherein the gas flow rate of reactive gas is about 70 sccm and the gas flow rate of the inert gas is about 30 sccm.

Example 1

Figure 6:
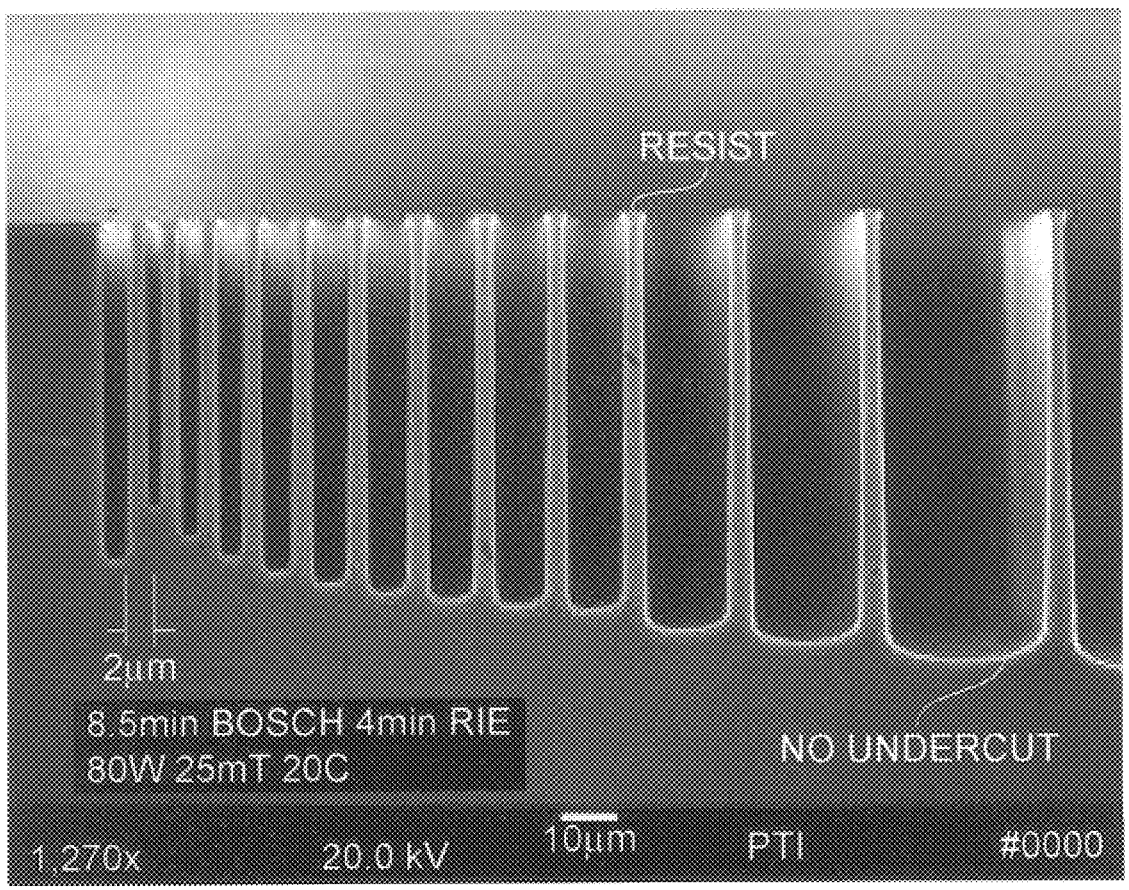
FIG. 6 is a SEM photo wherein the two trenches on the right have been etched down to the oxide with no signs of undercut. Lag is evident from the varying etch depths. Narrower trenches exhibit more lag.

FIG. 6 results from a standard Bosch process followed by a non cyclic RIE process which encompasses the clearing phase of the etching process. The two trenches on the right of FIG. 6 have been etched down to the oxide layer and there are no signs of undercut. This shows that the preferred RIE only etch approach has the ability to eliminate undercutting at the oxide/silicon interface. Thus, the RIE approach is well suited for substrates having a wide range of aspect ratios.

The ability to continuously etch to the oxide interface using a process such as the Bosch process needs a suitable endpoint detector, since the timing of the process which prevents undercutting is important. Such endpoint detectors are known to those skilled in the art.

In another embodiment of the invention, the present inventors have developed an etching process wherein RIE, which serves to reduce undercut through its drop in ion density, is combined with a polymer deposition step, whereby the polymer deposition on the walls is increased and serves to protect from undercut. By utilizing this technique, it is possible to eliminate RIE lag. However, in using this process the time which is required to sufficiently etch the desired feature will increase. The smaller the trench width, the longer the time required to clear it. However, if the ratio of the largest to smallest trench is a small, the overetch time will be small.

Example 2

Figure 7:
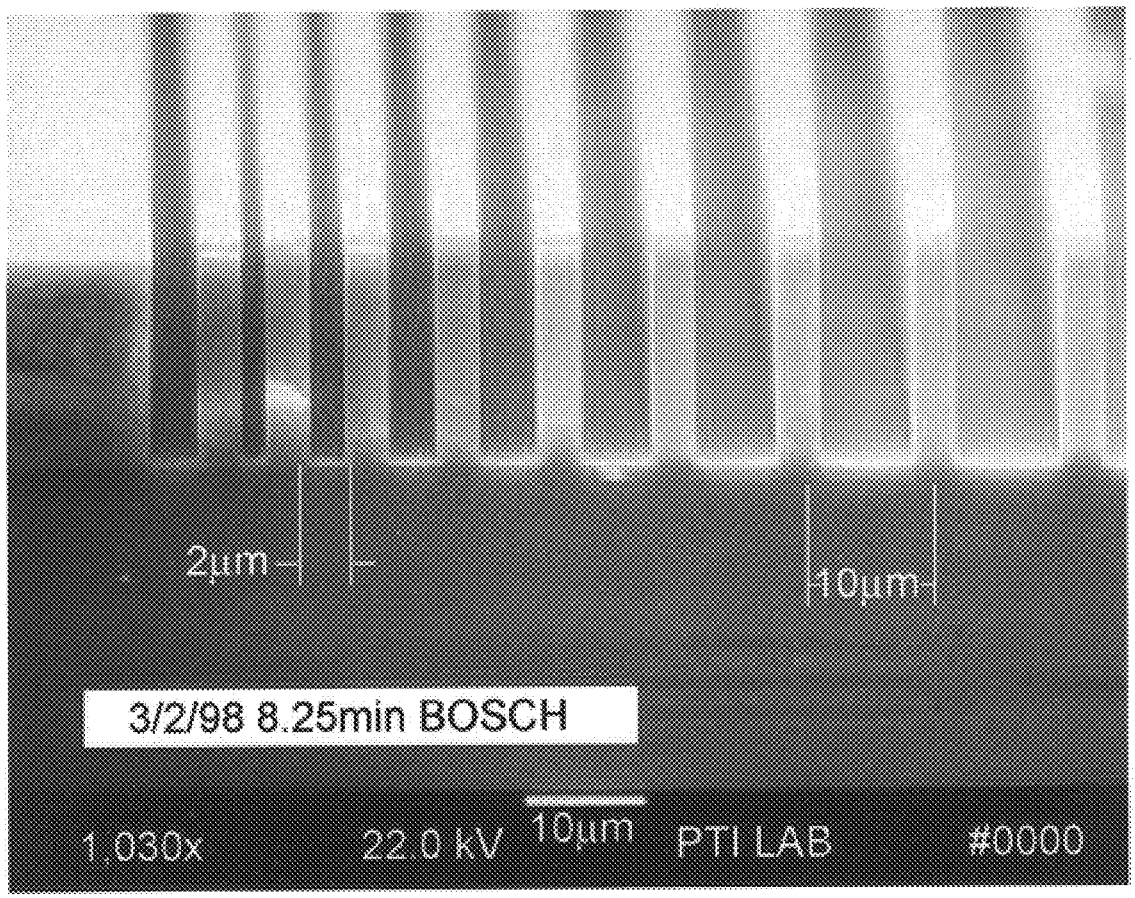
FIG. 7 is a SEM photo that shows the range from 2 to 10 $\mu$m trench widths, where the sidewalls are much straighter in comparison to FIG. 6 and little undercut is present.

Utilizing the above mentioned technique, experiments were performed to demonstrate this aspect of the inventive process. The trench widths ran from as low as 2 μm to as high as 100 μm. The results from one of these runs are shown in FIG. 7. The bulk of the etching is performed according to the Bosch process followed by the inventive etching process, which includes a cyclic deposition and etching process. FIG. 7 shows the range from 2 to 10 μm trench widths. The sidewalls shown in FIG. 7 are much straighter in comparison to FIG. 6. There is very little undercut present, even with long overetch times. The success of this technique relies on the ability to clear the larger trenches with a standard etching process known to those skilled in the art before changing over to the inventive etch process to etch the remaining silicon as a "finishing" etch.

In one embodiment of the invention, an initial plasma etching step is performed in accordance with the Bosch process, where no consideration need be given to a specific ratio of saturated to unsaturated species, that is, of fluorine radicals to polymer forming compounds, so that the actual etching step can be optimized with respect to the etching rate and selectivity without the anisotropy of the total process being adversely affected. Subsequent to the initial plasma etching step and polymerization step, the inventive RIE process having a reduced ion current density is performed.

In an alternate embodiment of the invention, the silicon substrates are bombarded with ionic energy during an initial plasma etching process and alternately during a polymerization process in accordance with the Bosch process. By means of this simultaneous bombardment with ionic energy, no or substantially no polymer can form on the etching base, thus a higher etching rate can be achieved during the initial etching step, because a prior, necessary decomposition of the polymer layer on the etching base is not required. As a result of this bombardment of low ionic energy, an outstanding mask selectivity and anisotropic result may be achieved.

Considerable warming of the silicon substrate may result from the strong exothermic reaction of fluorine radicals with silicon which occurs with high etching rates, such as during the initial etching process. Therefore, the silicon substrate is preferably cooled during the etching process, preferably by a helium gas current. It is preferable to cool the substrate as high temperature promote etching of the polymer deposition and mask layers.

It is necessary to maintain the low ion density in the clearing step as described previously in order to complete the "finish" etch to produce deep structures, such as trenches, having sharp vertical edges without substantial undercutting. High ionic energies generally lead to interfering reactions of material that was dispersed or was stripped and then redeposited uncontrolled. The energy of the ions acting on the silicon substrate must be sufficient, however, to keep the structure base free from deposits, so that a smooth etching base can be obtained.

If the silicon substrate is already bombarded with low ionic energy during the polymerization, little or no polymer is formed on the etching base. The monomers capable of polymerization therefore preferably build up on the side walls, and provide a particularly effective protection there against the clearing phase, whereas the etching base remains free or substantially free from any covering.

With both alternatives, ionic effect only during the plasma etching step, or ionic effect during both the plasma etching and the polymerization steps, structures exhibiting very high anisotropy, i.e., having practically exactly vertical edge profiles with substantially no undercutting are achieved.

In a preferred embodiment, an anisotropic etch can be achieved with low ionic energies. When no polymer is deposited on the etching base during the polymerization step, ionic energies of only approximately 5 eV can be used. During the initial etching step, ion bombardment with energies between 5 and 30 eV are recommended in order to leave the structure base completely free from deposits from the plasma, so that no roughness of the etching base can be established at first. If ions are only accelerated toward the silicon substrate during the clearing step, these are also sufficient to break through, within a few seconds, the etching base polymer that deposits during the polymerization step. In this operating mode, the microloading effect in the etching rate is further reduced.

Due to the high spontaneous reaction rate of fluorine radicals with silicon, the silicon etching per se requires no ion support.

A preferred embodiment of the invention for anisotropically etching a silicon substrate is performed in the following manner.

A silicon substrate was patterned and coated with an etching mask, for example a photoresist, with the etching mask leaving free the regions of the silicon substrate that are intended to be anisotropically etched, is subjected to a first etching step. It will be understood that etching masks other than photoresist known to those skilled in the art is within the scope of the invention.

A mixture of a fluorinated gas, such as, $SF_6$, $NF_3$, and $CF_4$, and an inert gas, such as argon, Ar, may be used for the initial etch, which has a gas flow of between 0 and 500 sccm and a processing pressure between 5 and 100 mT. The plasma generation for the bulk or initial etch preferably takes place with an RF excitation or other high density source at outputs between 300 and 1200 W (up to about 2.45 GHz).

At the same time, a substrate RF (radio frequency) bias for ion acceleration is applied to the substrate electrode. The substrate bias is preferably between 5 and 100V, and can be achieved with a high-frequency supply (13.56 MHz) at outputs between 2 and 20 W.

During the initial etching, chemically reactive species and electrically-charged particles (ions) are generated in the reactor with the aid of an electrical discharge in the mixture of fluorinated gas and inert gas.

The positively-charged cations generated in this way are accelerated toward the silicon substrate by means of the RF bias applied to the substrate electrode, and fall nearly vertically onto the substrate surface left free by the etching mask, and facilitate the chemical reaction of the reactive plasma species with the silicon.

The etching may be performed for a time period in order to yield an etch depth of about 5 μm to about 500 μm. The absolute depth of the recess is dependent upon the thickness of the substrate to be etched and the amount of etching desired.

In the polymerizing deposition process, a mix of, for example, a fluorinated gas such as $CHF_3$ and argon (Ar) may be used, other perfluorinated aromatic substances having suitable peripheral groups, for example, perfluorinated, styrene-like monomers or ether-like fluorine compounds also may be used.

During the polymerization, the surfaces exposed during the previous etching, the etching base and the side walls, are covered with a polymer. This polymer layer forms an etching stop on the etching edges or etching surfaces.

The polymer applied to the etching edge in the polymerization step is partially re-stripped during the subsequent clearing phase which involves a reactive ion etching step. During the reactive ion etching step, the edge exposed during an initial etching step is protected from further etching attack by means of the polymer layer. In the reactive ion etching process, a mixture of a fluorinated gas, such as $F_2$, $SiF_4$, $C_2F_6$, MoFs, $WF_6$, $XeF_2$, $SF_6$, $C_3F_8$, $NF_3$, $CHF_3$, and $CF_4$, and an inert gas, such as argon, Ar, may be used. The clearing etch can be cyclic and repeated, that is, followed by a polymerizing deposition with further etching. The polymerizing deposition which is cyclically repeated with the clearing etch uses a fluorinated gas, for example, $CHF_3$, $CH_3F$, $C_2H_2F_2$, $C_2H_2F_4$, $C_3F_8$, and $C_4F_8$. The gas mixtures have a flow rate of from about 0 to 250 sccm, and preferably from about 0 to 100 sccm. The pressure of the process is from about 1 and 200 mT, and preferably from 10 to 100 mT. At an output preferably between 300 and 1200W, a microwave, ICP, TCP, helicon, ECR or other high density excitation source.

It is known that there is a tendency of released monomers to precipitate so as to be directly contiguous to one another again has the positive consequence of effecting an additional local sidewall protection during the clearing step. That is, polymer that are stripped during the etching phase can be redeposited on the sidewalls. The result of the release of monomers is that the anisotropy of the etching and clearing steps, which occur separately from the polymerization steps in the plasma, is significantly increased by this effect.

The polymerization step is selected to be long enough so that during polymerization a Teflon-like polymer layer can precipitate on the side walls or on the etching base. The thickness of the polymer layer is between about 1 and 100 nm, preferably between 10 and 75 nm, most preferably between about 40 and 50 nm thick. A time of, about 2 to 60 seconds is required to deposit the above thickness of polymer to the substrate.

In all media used, it is important to achieve high densities of reactive species, and ions with low energy, but precisely controllable energy, in which the generated ions reach the substrates.

Other embodiments of the invention will be apparent to those skilled in the art from consideration of the specification and practice of the invention disclosed herein. It is intended that the specification be considered as exemplary only, with the true scope and spirit of the invention being indicated by the following claims. Additionally, all documents referred to herein are expressly incorporated by reference.

What is claimed is:

1. A method of preventing undercut at a silicon-insulator interface during etching of a silicon substrate comprising etching a silicon substrate by reactive ion etching employing plasma, wherein ion density is reduced, thereby providing a vertical etch of sidewalls formed during the etching.

2. The method of claim 1, further comprising polymerizing by introducing at least one polymer forming compound into the plasma, wherein the compound is deposited on the exposed surfaces of the silicon thereby creating a temporary coating layer.

3. The method of claim 2, wherein the reactive ion etching and polymerizing are cyclic and are repeated.

4. A method of preventing undercut at a silicon-insulator interface during etching of a silicon substrate comprising:
   a) anisotropic plasma etching by contacting a reactive etching gas with the silicon to remove material from the surface of the silicon and provide etched surfaces;
   b) polymerizing and depositing at least one polymer forming compound on the exposed surfaces of the silicon thereby creating a temporary coating layer by introducing the compound into the plasma; and
   c) reactive ion etching having a reduced ion density of less than about $10^9$ ions/cm$^3$, wherein reactive ions are provided in plasma for impinging on the surface of the silicon.

5. The method of claim 4, wherein etching a) is performed with substantially no polymer forming compound in the plasma.

6. The method of claim 4, wherein the polymer applied during depositing b) to a laterally defined recess structure formed by etching a) is partially etched during reactive ion etching c).

7. The method of claim 4, wherein the reactive etching gas is a mixture of sulfur hexatluoride and argon.

8. The method of claim 4, wherein the first etching step removes material from the surface of the silicon to a depth, and wherein the first etching step is performed over a period of time which provides the etching depth.

9. The method of claim 4, wherein the reactive ions used in the reactive ion etching c) are selected from the group consisting of $F_2$, $SiF_4$, $C_2F_6$, $MOF_5$, $WF_6$, $XeF_2$, $SF_6$, $C_3F_8$, $NF_3$, $CHF_3$, and $CF_4$.

10. The method of claim 4, wherein the silicon surface is patterned prior to plasma etching.

11. The method of claim 4, wherein etching a) and depositing b) are alternately repeated prior to performing reactive ion etching c).

12. The method of claim 4, further comprising an additional polymerizing process following the reactive ion etching.

13. The method of claim 12, wherein the additional polymerizing process and the reactive ion etching are cyclic and repeated.

14. A method of etching that avoids undercut of a silicon substrate comprising, comprising reactive ion etching a silicon substrate at sufficient ion velocity, ion density, ion mass, bias, power and pressure to attain an ion density less than about 10 ions/cm$^3$.

15. The method of claim 1, further comprising applying a low density power source to the silicon substrate wherein the power supplied is in the range of between about 5 and 500 watts.

16. The method of claim 4, further comprising applying a low density power source to the silicon substrate during reactive ion etching c), wherein the power supplied is in the range of between about 5 and 500 watts.

17. The method of claim 1 or 4, wherein the flow rate of the gas used during etching is about 100–200 sccm and the flow rate of the gas used during polymerizing is about 0–100 sccm.

18. The method of claim 1 or 4, wherein the pressure of the etching, polymerizing and reactive ion etching processes is between about 1 mT and 500 mT.

19. The method of claim 1 or 4, wherein the temperature of the process is between about 15° C. and 25° C.

20. A method etching that avoids undercut of a silicon substrate comprising, etching a silicon substrate by reactive ion etching employing plasma at reduced ion density.

21. The method of claim 20, further comprising polymerizing by introducing at least one polymer forming compound into the plasma, wherein the compound is deposited on the exposed surfaces of the silicon thereby creating a temporary coating layer.

22. The method of claim 21, wherein the reactive ion etching and polymerizing are performed in a cyclic manner.

23. The method according to claim 20, wherein the ion density is no more than about $10^9$ ions/cm$^3$.

24. The method of claim 20, further comprising applying a low density power source to the silicon substrate wherein the power supplied is in the range of between about 5 and 500 watts.

25. The method of claim 21, wherein the flow rate of the gas used during etching is about 100–200 sccm and the flow rate of the gas used during polymerizing is about 0–100 sccm.

26. The method of claim 21, wherein the pressure of the etching, polymerizing and reactive ion etching processes is between about 1 mT and 500 mT.

27. The method of claim 20, wherein the process is carried out at a temperature between about 15° C. and 25° C.

* * * * *